United States Patent
Hayes

(10) Patent No.: US 12,065,266 B2
(45) Date of Patent: Aug. 20, 2024

(54) CROSS-CONNECTION TEST FOR AIRCRAFT LANDING GEAR

(71) Applicant: AIRBUS OPERATIONS LIMITED, Bristol (GB)

(72) Inventor: Alexander Hayes, Bristol (GB)

(73) Assignee: AIRBUS OPERATIONS LIMITED, Bristol (GB)

( * ) Notice: Subject to any disclaimer, the term of this patent is extended or adjusted under 35 U.S.C. 154(b) by 514 days.

(21) Appl. No.: 17/375,660

(22) Filed: Jul. 14, 2021

(65) Prior Publication Data
US 2022/0017237 A1 Jan. 20, 2022

(30) Foreign Application Priority Data
Jul. 15, 2020 (GB) .................................... 2010884

(51) Int. Cl.
- *B64F 5/60* (2017.01)
- *B60T 17/22* (2006.01)
- *B64C 25/44* (2006.01)
- *G01L 5/28* (2006.01)
- *G01R 31/55* (2020.01)

(52) U.S. Cl.
CPC ............... *B64F 5/60* (2017.01); *B64C 25/44* (2013.01)

(58) Field of Classification Search
None
See application file for complete search history.

(56) References Cited

U.S. PATENT DOCUMENTS

| | | | | |
|---|---|---|---|---|
| 3,872,720 | A | * 3/1975 | Fleagle | G01L 5/28 73/121 |
| 2010/0106347 | A1 | * 4/2010 | Cahill | B64C 25/44 701/3 |
| 2011/0226049 | A1 | 9/2011 | Burgess et al. | |

FOREIGN PATENT DOCUMENTS

| | | | |
|---|---|---|---|
| DE | 102014213208 A1 * | 1/2016 | ............. B60T 17/22 |
| DE | 102018219443 A1 * | 2/2020 | ............ B60T 13/662 |
| GB | 1 475 508 | 6/1977 | |
| GB | 2 047 829 | 12/1980 | |
| GB | 2 215 419 | 9/1989 | |

OTHER PUBLICATIONS

Combined Search and Examination Report for GB2010884.1 dated Jan. 8, 2021, 7 pages.
Thoreau, Braking system cross connections, Feb. 2009, 7 pages.

* cited by examiner

*Primary Examiner* — Jill E Culler
*Assistant Examiner* — Ruben C Parco, Jr.
(74) *Attorney, Agent, or Firm* — Nixon & Vanderhye P.C.

(57) ABSTRACT

A method of testing an aircraft landing gear is disclosed including: a) generating a test signal with the first tachometer, wherein the first wheel is not rotating during the generation of the test signal; b) receiving the test signal via one of the tachometer output lines; c) issuing a braking command in response to the receipt of the test signal, wherein the braking command is issued via the braking command line which is associated with the one of the tachometer output lines; and d) monitoring a response of the first or second braking system to the braking command to test for a cross-connection between the first and second braking systems. The landing gear includes first and second wheels; a first braking system having a first tachometer mounted to the first wheel and configured to generate a first (Continued)

tachometer signal indicating rotation of the first wheel, and
a first brake configured to brake the first wheel.

18 Claims, 13 Drawing Sheets

CROSS-CONNECTION TEST FOR AIRCRAFT LANDING GEAR

CROSS REFERENCE TO RELATED APPLICATION

This application claims priority to United Kingdom Patent Application No. GB 2010884.1, filed Jul. 15, 2020, the entire contents of which is hereby incorporated by reference.

FIELD OF THE INVENTION

The present invention relates to a method of testing an aircraft landing gear to test for a cross-connection between braking systems; a method of generating a test signal with a tachometer of an aircraft landing gear; and an aircraft landing gear system configured to perform such methods.

BACKGROUND OF THE INVENTION

When the tachometers, servo valves or pressure transducers on an aircraft landing gear braking system are changed, then a test may be required to ensure that there is no cross connection. This is conventionally done by activating an anti-skid system and spinning the wheels at different speeds using a pair of drills. An operator in the aircraft cockpit can then see which wheel the system thinks it needs to brake, and which wheel it is actually braking.

The conventional method suffers from a number of problems. Firstly, the landing gear must be raised from the ground to enable the wheels to be spun. Secondly, a pair of drills is needed to spin the wheels fast enough for the anti-skid system to recognise the differential speed. Thirdly, the method requires three operators: two on the ground and one in the cockpit.

SUMMARY OF THE INVENTION

A first aspect of the invention provides a method of testing an aircraft landing gear, the aircraft landing gear comprising: first and second wheels; a first braking system comprising a first tachometer mounted to the first wheel and configured to generate a first tachometer signal indicating rotation of the first wheel, and a first brake configured to brake the first wheel; a second braking system comprising a second tachometer mounted to the second wheel and configured to generate a second tachometer signal indicating rotation of the second wheel, and a second brake configured to brake the second wheel; first and second tachometer output lines; a first braking command line associated with the first tachometer output line; and a second braking command line associated with the second tachometer output line. The method comprises: a) generating a test signal with the first tachometer, wherein the first wheel is not rotating during the generation of the test signal; b) receiving the test signal via one of the tachometer output lines; c) issuing a braking command in response to the receipt of the test signal, wherein the braking command is issued via the braking command line which is associated with the one of the tachometer output lines; and d) monitoring a response of the first or second braking system to the braking command to test for a cross-connection between the first and second braking systems.

The test signal may be generated by rotating part of the first tachometer.

The first tachometer may comprise a tachometer rotor configured to rotate with the first wheel and a tachometer sensor configured to measure rotation of the tachometer rotor to generate the first tachometer signal. The test signal may be generated by rotating the tachometer sensor of the first tachometer, or by rotating the tachometer rotor of the first tachometer.

The part of the tachometer may be rotated by less than a full revolution.

The part of the tachometer may be rotated back and forth by less than a full revolution.

The response of the first or second braking system may be monitored by a human watching the first or second brake.

The response of the first or second braking system may be monitored by an automated monitoring system.

Monitoring a response of the first or second braking system may comprise monitoring whether the first or second braking system responds to the braking command.

Monitoring a response of the first or second braking system may comprise monitoring whether one of the brakes has been applied and not released.

The braking command may be issued on only one of the braking command lines.

A cross-connection may be indicated if the second braking system responds to the braking command.

Monitoring a response of the first or second braking system may comprise monitoring whether the first or second braking system responds to the braking command to test for a cross-connection between the first and second tachometers.

Optionally the first braking system comprises a first servo valve; the second braking system comprises a second servo valve; the braking command is issued to one of the servo valves; and monitoring a response of the first or second braking system comprises monitoring whether the first or second braking system responds to the braking command to test for a cross-connection between the first and second servo valves.

Optionally the first braking system further comprises a first pressure transducer; the second braking system further comprises a second pressure transducer; and monitoring the response of the first or second braking system comprises monitoring whether the first or second pressure transducer responds to the braking command.

Optionally the first braking system further comprises a first pressure transducer configured to measure a hydraulic pressure in the first braking system to generate a pressure signal; the second braking system further comprises a second pressure transducer configured to measure a hydraulic pressure in the second braking system to generate a pressure signal; the aircraft landing gear further comprises a first pressure transducer line associated with the first tachometer output line and a second pressure transducer line associated with the second tachometer output line; and monitoring the response of the first or second braking system comprises monitoring whether a pressure signal is received on the first or second pressure transducer line.

Optionally the first braking system comprises a first servo valve and a first pressure transducer; the second braking system comprises a second servo valve and a second pressure transducer; and monitoring the response of the first and second braking systems tests for a cross-connection between the first and second tachometers, a cross-connection between the first and second servo valves and a cross-connection between the first and second pressure transducers.

A further aspect of the invention provides a method of generating a test signal with a tachometer of an aircraft landing gear, the aircraft landing gear comprising: a wheel;

and a tachometer mounted to the wheel, wherein the tachometer comprises a tachometer rotor configured to rotate with the wheel and a tachometer sensor configured to measure rotation of the tachometer rotor to generate a tachometer signal indicating rotation of the wheel, the method comprising: generating a test signal by decoupling the tachometer rotor from the wheel and then rotating the tachometer rotor without rotating the wheel.

A further aspect of the invention provides an aircraft landing gear comprising: a wheel; and a tachometer comprising a tachometer rotor configured to rotate with the wheel, and a tachometer sensor configured to measure rotation of the tachometer rotor to generate a tachometer signal indicating rotation of the wheel, wherein the tachometer rotor is connected to the wheel by a floating connection which is configured to enable the tachometer rotor to be rotated without rotating the wheel to generate a test signal.

The floating connection may be configured to enable the tachometer rotor to be rotated by more than 10° without rotating the wheel.

A further aspect of the invention provides a method of testing and repairing an aircraft landing gear, the method comprising: testing the aircraft landing gear by a method according to the first aspect to identify a cross-connection between the first and second braking systems; and repairing the cross-connection between the first and second braking systems in response to the identification of the cross-connection.

A further aspect of the invention provides an aircraft landing gear system comprising: first and second wheels; a first braking system comprising a first tachometer mounted to the first wheel, and a first brake configured to brake the first wheel, wherein the first tachometer is configured to generate a first tachometer signal indicating rotation of the first wheel and further configured to generate a first test signal, wherein the first wheel is not rotating during the generation of the first test signal; a second braking system comprising a second tachometer mounted to the second wheel, and a second brake configured to brake the second wheel, wherein the second tachometer is configured to generate a second tachometer signal indicating rotation of the second wheel and further configured to generate a second test signal, wherein the second wheel is not rotating during the generation of the second test signal; first and second tachometer output lines; a first braking command line associated with the first tachometer output line; a second braking command line associated with the second tachometer output line; and a braking control and monitoring system configured to: receive the first or second test signal via one of the tachometer output lines; issue a braking command in response to the receipt of the first or second test signal, wherein the braking command is issued via the braking command line which is associated with the one of the tachometer output lines; and monitor a response of the first or second braking system to the braking command to test for a cross-connection between the first and second braking systems.

The first tachometer may comprise a first tachometer rotor configured to rotate with the first wheel; and a first tachometer sensor configured to measure rotation of the first tachometer rotor to generate the first tachometer signal.

The second tachometer may comprise a second tachometer rotor configured to rotate with the second wheel; and a second tachometer sensor configured to measure rotation of the second tachometer rotor to generate the second tachometer signal.

The first tachometer rotor may be connected to the first wheel by a first floating connection which enables the first tachometer rotor to be rotated without rotating the first wheel to generate the first test signal. Alternatively the tachometer sensor may be rotatable to generate the test signal, the first tachometer rotor and first wheel both remaining stationary during generation of the test signal.

The second tachometer rotor may be connected to the second wheel by a second floating connection which enables the second tachometer rotor to be rotated without rotating the second wheel to generate the second test signal. Alternatively the tachometer sensor may be rotatable to generate the test signal, the second tachometer rotor and second wheel both remaining stationary during generation of the test signal.

BRIEF DESCRIPTION OF THE DRAWINGS

Embodiments of the invention will now be described with reference to the accompanying drawings, in which.

DETAILED DESCRIPTION OF EMBODIMENT(S)

Figure 1:
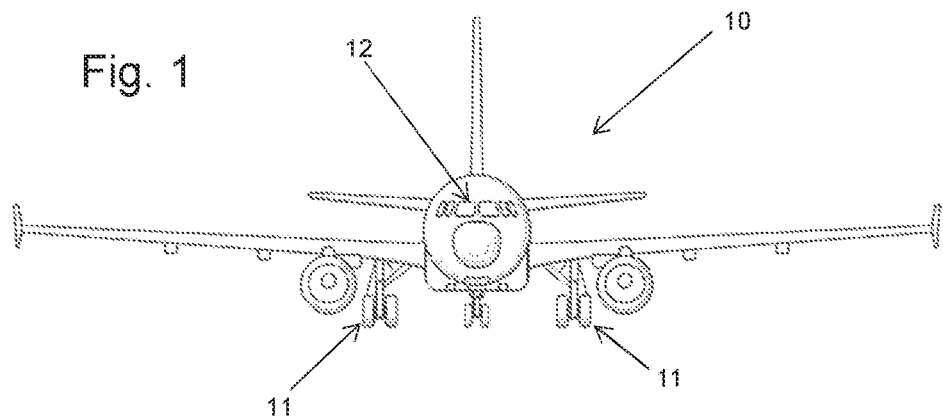
FIG. 1 shows an aircraft.

An aircraft 10 shown in FIG. 1 has a nose landing gear, and a pair of main landing gears 11. One of the main landing gears 11 is shown in detail in FIG. 2, along with its associated braking control and monitoring system 29.

The main landing gear 11 comprises first and second wheels 20a, 20b, each with an associated braking system 21a, 21b.

The first braking system 21a comprises a first tachometer 22a mounted to the first wheel and configured to generate a first tachometer signal indicating rotation of the first wheel, and a first brake 23a configured to brake the first wheel.

The second braking system 21b comprises a second tachometer 22b mounted to the second wheel and configured to generate a second tachometer signal indicating rotation of the second wheel, and a second brake 23b configured to brake the second wheel.

The braking systems 21a, 21b further comprise first and second servo valves 30a, 30b; first and second fuses 40a, 40b; and first and second pressure transducers 50a, 50b.

A braking control and monitoring system 29 is configured to control and monitor the braking systems 21a, 21b, by issuing braking commands to the braking systems 21a, 21b and monitoring their responses as discussed below.

Figure 2:
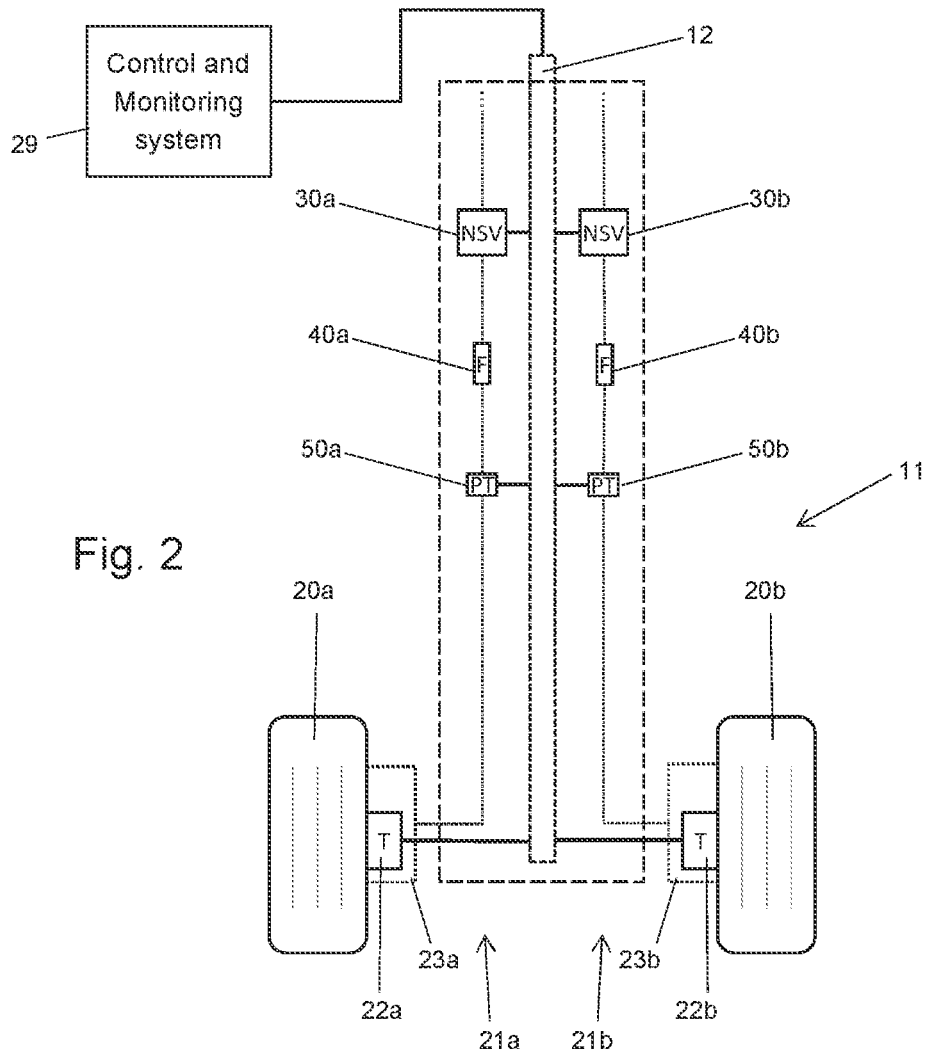
FIG. 2 shows a landing gear system.
Figure 3:
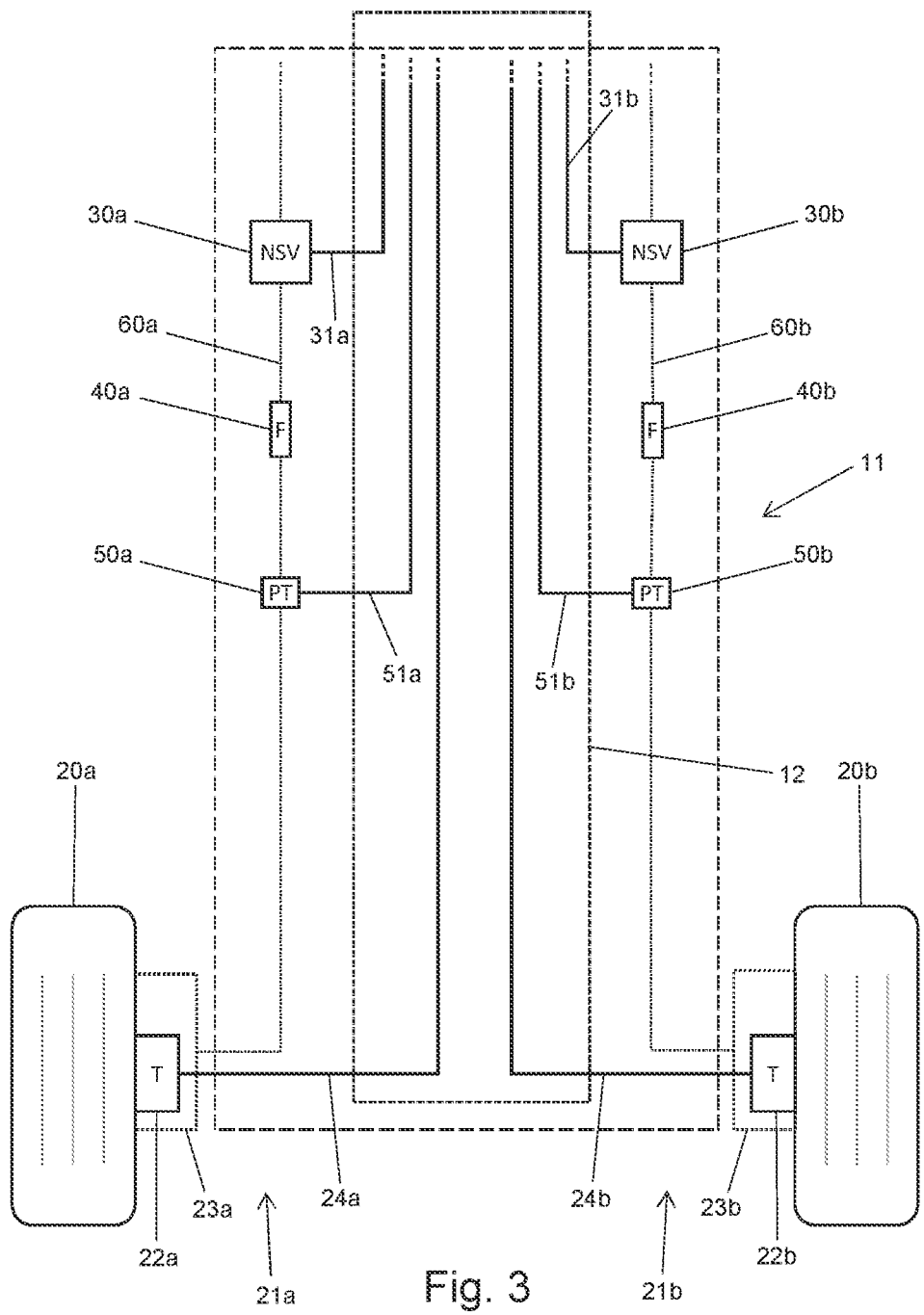
FIG. 3 shows the harness lines of the landing gear.

The braking control and monitoring system 29 is connected to the braking systems by a harness 12 shown in FIG. 2 with two sets of harness lines shown in FIG. 3: a first set of harness lines 24a, 31a, 51a which the braking control and monitoring system 29 associates with each other (and with the first braking system 21a); and a second set of harness lines 24b, 31b, 51b which the braking control and monitoring system 29 associates with each other (and with the second braking system 21b).

The first and second tachometers 22a, 22b are connected to first and second tachometer output lines 24a, 24b; the first and second servo valves 30a, 30b are connected to first and second braking command lines 31a, 31b; and the first and second pressure transducers 50a, 50b are connected to first and second pressure transducer output lines 51a, 51b.

The first braking command line 31a, the first tachometer output line 24a and the first pressure transducer output line 51a are associated with each other; and similarly the second braking command line 31b, the second tachometer output line 24b and the second pressure transducer output line 51b are associated with each other.

Hydraulic fluid is supplied to the first and second braking systems by respective hydraulic lines 60a, 60b.

The first pressure transducer 40a is configured to measure a hydraulic pressure in the hydraulic line 60a to generate a pressure signal. Similarly the second pressure transducer 40b is configured to measure a hydraulic pressure in the hydraulic line 60b to generate a pressure signal.

Figure 4:
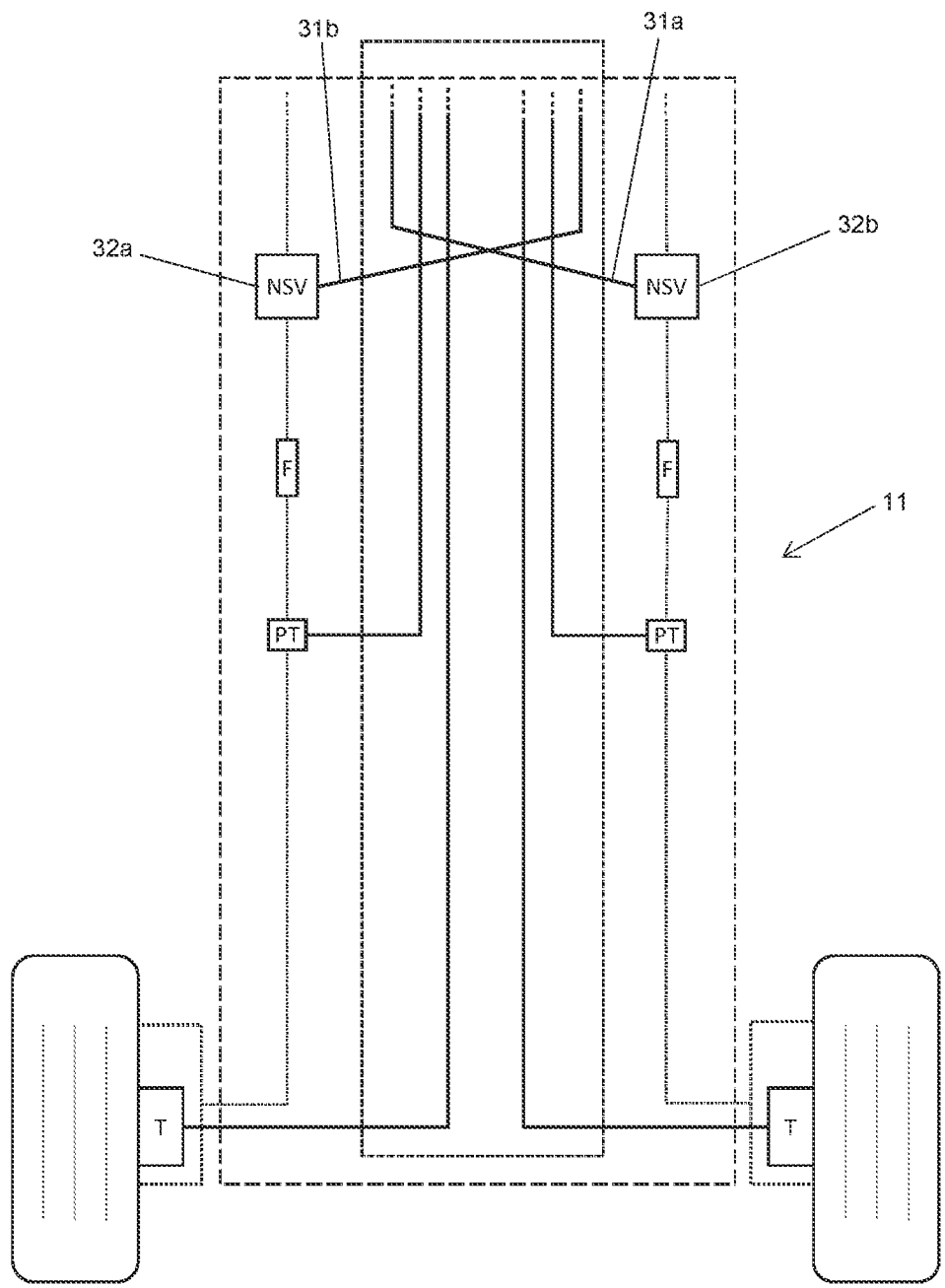
FIG. 4 shows a servo valve cross-connection.
Figure 5:
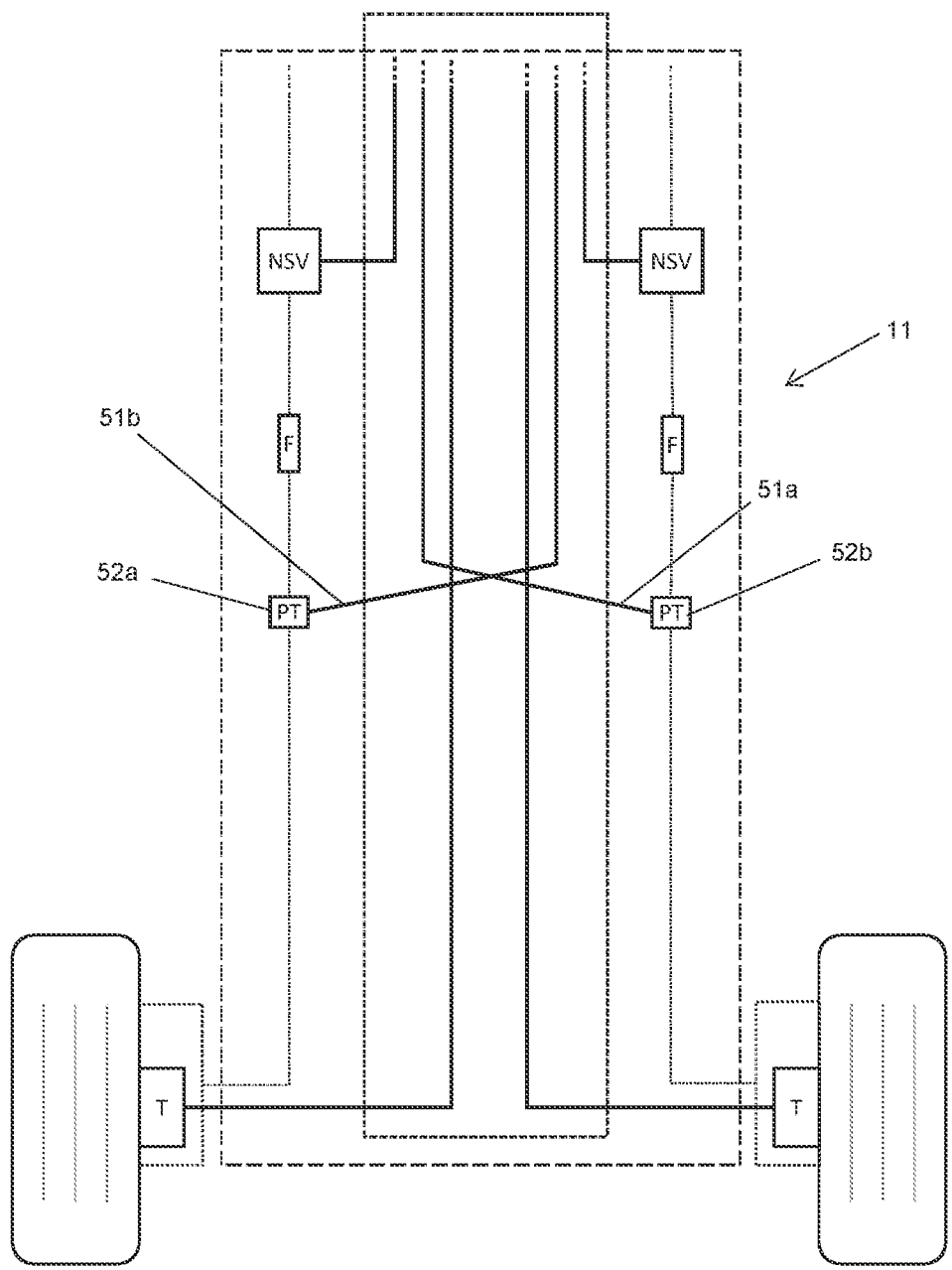
FIG. 5 shows a pressure transducer cross-connection.
Figure 6:
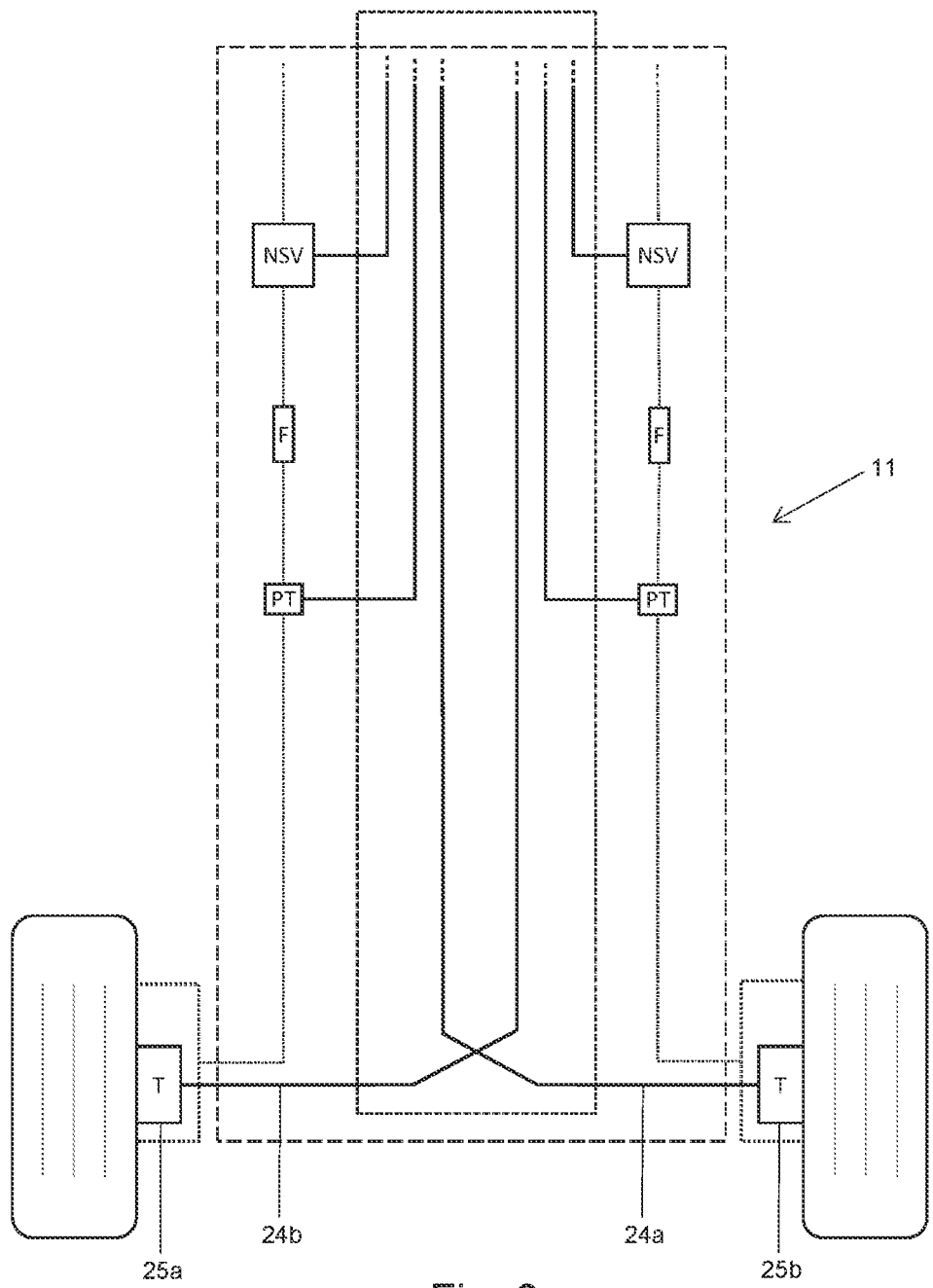
FIG. 6 shows a tachometer cross-connection.

FIGS. 4-6 show various cross-connection errors between the first and second braking systems which can occur during replacement of one or more components of the braking systems.

If the servo valves 30a, 30b are replaced, then they are disconnected from their respective braking command lines 31a, 31b, and new servo valves 32a, 32b installed as shown in in FIG. 4. FIG. 4 shows a servo valve cross-connection error in which the new servo valves have been connected to the wrong harness lines. That is, the new servo valve 32a of the first braking system 21a has been incorrectly connected to the braking command line 31b of the second braking system 21b; and the new servo valve 32b of the second braking system 21b has been incorrectly connected to the braking command line 31a of the first braking system 21a.

If the pressure transducers 50a, 50b are replaced, then they are disconnected from their respective harness lines, and new pressure transducers 52a, 52b installed as shown in in FIG. 5. FIG. 5 shows a pressure transducer cross-connection error in which the new pressure transducers have been connected to the wrong harness lines. That is, the new pressure transducer 52a of the first braking system 21a has been incorrectly connected to the pressure transducer output line 51b of the second braking system 21b; and the new pressure transducer 52b of the second braking system 21b has been incorrectly connected to the first pressure transducer output line 51a of the first braking system 21a.

If the tachometers 22a, 22b are replaced, then they are disconnected from their respective harness lines, and new tachometers 25a, 25b installed as shown in in FIG. 6. FIG. 6 shows a tachometer cross-connection error in which the new tachometers have been connected to the wrong harness lines. That is, the output port of the new tachometer 25a of the first braking system 21a has been incorrectly connected to the second tachometer output line 24b of the second braking system 21b; and the output port of the new tachometer 25b of the second braking system 21b has been incorrectly connected to the first tachometer output line 24a of the first braking system 21a.

Figure 7:
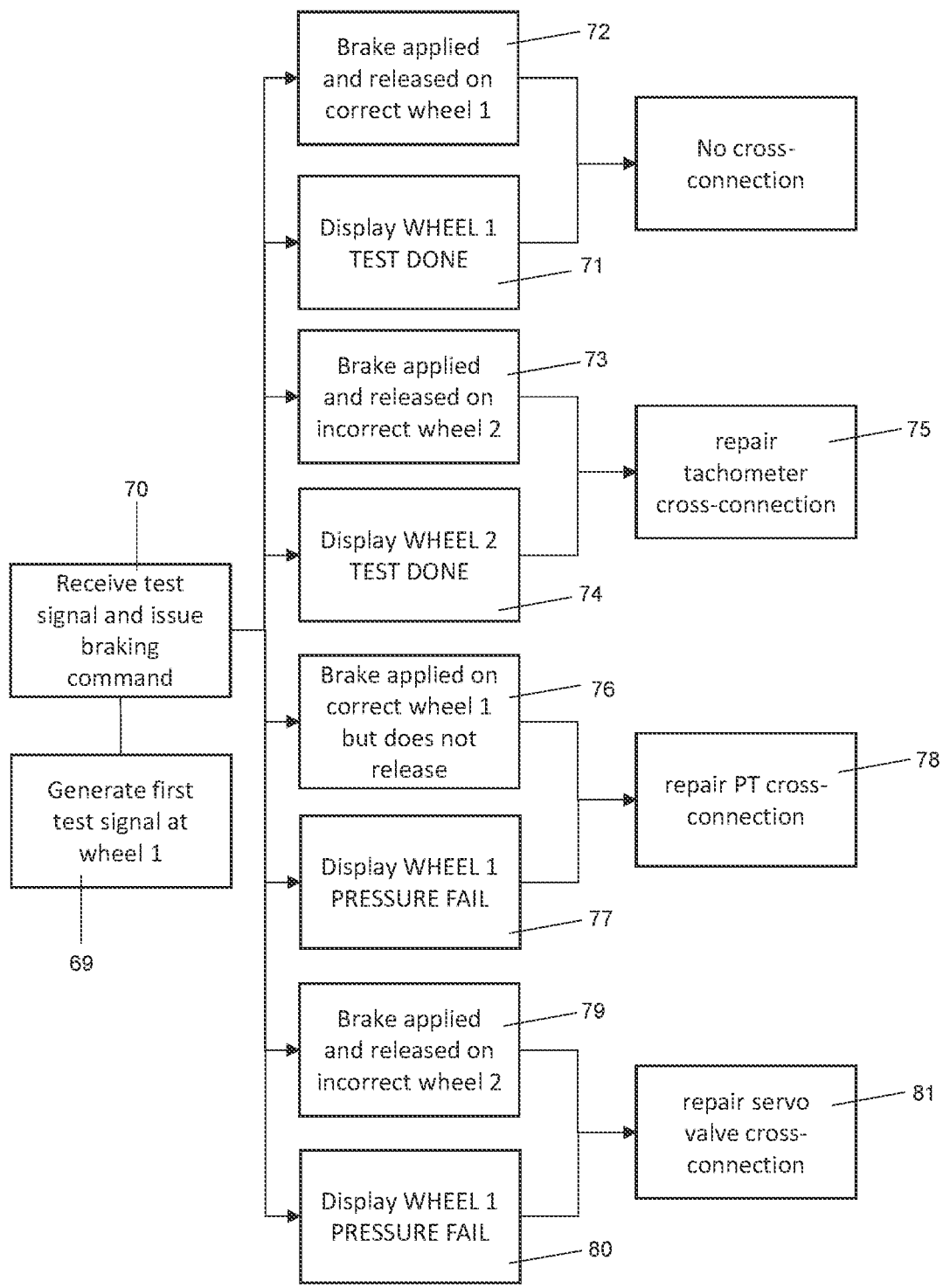
FIG. 7 shows a method of testing the first wheel of the landing gear.

A method of testing the aircraft landing gear 11 for such cross-connections is shown in FIG. 7. Note that in FIG. 7 the first wheel 20a is referred to as wheel 1 and the second wheel 20b is referred to as wheel 2.

A first test signal is generated in step 69 by the first tachometer 22a. The first test signal may be generated in a number of ways which are described in detail below with reference to FIGS. 9-14.

In general terms, the first tachometer 22a comprises a first part (a tachometer rotor) configured to rotate with the first wheel; and a second part (a tachometer sensor) configured to measure rotation of the tachometer rotor to generate the first tachometer signal. The first test signal is generated by manually rotating part of the tachometer: either the tachometer rotor or the tachometer sensor. The first wheel 20a is not rotating during the generation of the first test signal.

Thus the first tachometer 22a is not only configured to generate a first tachometer signal indicating rotation of the first wheel 20a, but may be further configured to generate a first test signal. The first wheel 20a is not rotating during the generation of the first test signal.

The part of the tachometer may be rotated by back and forth, typically by less than a full revolution. The test signal may be generated for any period of time. For instance the part of the tachometer may be rotated back and forth for 1.5 s, 500 ms or 150 ms.

This generates the first test signal which is fed to the braking control and monitoring system 29 by either the first tachometer output line 24a of the first braking system or, in the case of a tachometer cross-connection error as shown in FIG. 6, by the second tachometer output line 24b of the second braking system.

The braking control and monitoring system 29 is configured to receive the first test signal via one of the tachometer output lines; issue a braking command in response to the receipt of the first test signal; and monitor a response of the first or second braking system to the braking command to test for a cross-connection between the first and second braking systems.

At step 70 the first test signal is received by the braking control and monitoring system 29 via one of the tachometer output lines, and the braking command is issued via the braking command line which the braking control and monitoring system 29 associates with the one of the tachometer output lines (i.e. the tachometer output line that the first test signal is received on). In other words, if the first test signal is received via the first tachometer output line 24a then the braking command is issued via the first braking command line 31a; and if the first test signal is received via the second tachometer output line 24b then the braking command is issued via the second braking command line 31b. Note that the braking command is issued on only one of the braking command lines.

The response of the braking systems is automatically monitored by the braking control and monitoring system 29, by monitoring whether a pressure signal is received on the first or second pressure transducer line. The response of the first or second braking system is also manually monitored by an operator on the ground, by observing the operation of the brakes.

FIG. 7 shows four possible sets of responses to the braking command.

In the case of no cross-connection, since there is no tachometer cross-connection error, the first test signal is received at the braking control and monitoring system 29 from the first tachometer output line 24a of the first braking system. This causes the braking command to be issued to the first braking system by a signal on the braking command line 31a of the first braking system 21a, which is associated with the first tachometer output line 24a. Since there is no servo valve cross-connection error, this will cause the servo valve 30a to open and operate the first brake 23a via the hydraulic line 60a.

The control and monitoring system 29 also receives a pressure signal from the first pressure transducer 50a via the first pressure transducer output line 51a which indicates that the pressure has changed on the correct hydraulic line 60a. As the first brake 23a is applied, the pressure increases and the first pressure transducer 50a communicates an "increased pressure" pressure signal to the control and monitoring system 29 via the first pressure transducer output line 51a. This acts as a confirmation that the correct brake is being applied, since the "increased pressure" pressure signal is received from the correct (first) pressure transducer output line 51a. After 10 seconds, the control and monitoring system 29 commands the first servo valve 30a to reset. This causes the pressure to drop and the first brake 23a to release. The first pressure transducer 50a communicates a "decreased pressure" pressure signal to the control and monitoring system 29 via the first pressure transducer output line 51a. This acts as a confirmation that the first brake has released. The control and monitoring system 29 responds to the receipt of this "decreased pressure" pressure signal by displaying WHEEL 1 TEST DONE in a cockpit display device in the cockpit 12 at step 71.

The operator on the ground who is manually rotating the part of the tachometer watches the first and second brakes 23a, 23b, and observes at step 72 that the correct brake (i.e. the first brake 23a) has been applied for 10 seconds and then released.

The operator on the ground who had manually rotated the part of the tachometer and observed at step 72 that the correct brake (i.e. the first brake 23a) has been applied and released may then move to the cockpit and observe the WHEEL 1 TEST DONE message to double-check that there is no cross-connection (since the operator on the ground knows that wheel 1 is the correct wheel). Alternatively the cockpit display may be observed by a second human operator in the cockpit, who communicates with the operator on the ground to determine which wheel is currently being tested (i.e. which tachometer was spun by the operator on the ground) and confirm that there is no cross-connection.

In the case of a tachometer cross-connection, the operator on the ground who is manually rotating the part of the tachometer watches the first and second brakes 23a, 23b, and observes at step 73 that the incorrect brake (i.e. the second brake 23b) has been applied and released.

Since there is a tachometer cross-connection error, the first test signal is received at the braking control and monitoring system 29 from the second tachometer output line 24b of the second braking system. This causes the braking command to be issued to the second braking system by a signal on the second braking command line 31b of the second braking system 21b, which the braking control and monitoring system 29 associates with the second tachometer output line 24b. Since there is no servo valve cross-connection error, this will cause the second servo valve 30b to open and operate the second brake 23b via the hydraulic line 60b.

The control and monitoring system 29 also receives a signal from the second pressure transducer 50b via the second pressure transducer output line 51b which indicates that the pressure has changed on the second hydraulic line 60b. As the second brake 23b is applied, the pressure increases and the second pressure transducer 50b communicates an "increased pressure" pressure signal to the control and monitoring system 29 via the second pressure transducer output line 51b. This acts as a confirmation that the incorrect (second) brake is being applied since the "increased pressure" pressure signal is received from the second pressure transducer output line 51a. After 10 seconds, the control and monitoring system 29 commands the second servo valve 30b to reset. This causes the pressure to drop and the second brake 23b to release. The second pressure transducer 50b communicates a "decreased pressure" pressure signal to the control and monitoring system 29 via the second pressure transducer output line 51b. This acts as a confirmation that the second brake has released. The control and monitoring system 29 responds to the receipt of this "decreased pressure" pressure signal by displaying WHEEL 2 TEST DONE in the cockpit display device in the cockpit 12 at step 74.

The operator on the ground who had manually rotated the part of the tachometer and observed at step 73 that the incorrect brake (i.e. the second brake 23b) has been applied and released may then move to the cockpit and observe the WHEEL 2 TEST DONE message to determine that there is a tachometer cross-connection rather than a servo valve cross-connection (note that the operator on the ground knows that wheel 2 is the incorrect wheel). Alternatively the cockpit display may be observed by a second human operator, who communicates with the operator on the ground to determine which wheel is currently being tested (i.e. which tachometer was spun by the operator on the ground) and indicate that there is a tachometer cross-connection.

At step 75, once a tachometer cross-connection has been identified, it is repaired by switching the first and second tachometer output lines 24a, 24b so they are connected to the first and second tachometers 25a, 25b respectively. Thus the repair is performed in response to the identification of the tachometer cross-connection.

In the case of a pressure transducer cross-connection, the operator on the ground who is manually rotating the part of the tachometer watches the first and second brakes 23a, 23b, and observes at step 76 that the correct brake (i.e. the first brake 23a) has been applied but does not release.

Since there is no tachometer cross-connection error, the first test signal is received at the braking control and monitoring system 29 from the first tachometer output line 24a of the first braking system. This causes the braking command to be issued to the first braking system by a signal on the first braking command line 31a of the first braking system 21a, which the braking control and monitoring system 29 associates with the first tachometer output line 24a. Since there is no servo valve cross-connection error, this will cause the servo valve 30a to open and operate the first brake 23a via the hydraulic line 60a.

The control and monitoring system 29 also receives a pressure signal from the second pressure transducer output line 51b. As the first brake 23a is applied, the pressure increases and the second pressure transducer communicates an "increased pressure" pressure signal to the control and monitoring system 29 via the second pressure transducer output line 51b.

The control and monitoring system 29 monitors whether the first or second pressure transducer responds to the braking command. In this case, the control and monitoring system 29 expects a signal from the first pressure transducer output line 51a (because it associates the first pressure transducer output line 51a with the first tachometer output line 24a) but receives one instead from the second pressure transducer output line 51b. The lack of signal from the expected first pressure transducer output line 51a means that the control and monitoring system 29 does not command the first servo valve 30*a* to reset. Rather, the control and monitoring system 29 responds to the lack of signal on the first pressure transducer output line 51*a* by displaying WHEEL 1 PRESSURE FAIL on the cockpit display device in the cockpit 12 at step 77.

The operator on the ground who had manually rotated the part of the tachometer and observed at step 76 that the correct brake (i.e. the first brake 23*a*) has been applied and not released may then move to the cockpit and observe the WHEEL 1 PRESSURE FAIL message to double-check that there is a pressure transducer cross-connection (since the operator on the ground knows that wheel 1 is the correct wheel). Alternatively the cockpit display may be observed by a second human operator, who communicates with the operator on the ground to determine which wheel is currently being tested (i.e. which tachometer was spun by the operator on the ground) and identify that there is a pressure transducer cross-connection.

At step 78, once a pressure transducer cross-connection has been confirmed, it is repaired by switching the first and second pressure output lines 51*a*, 51*b* so they are connected to the first and second pressure transducers 52*a*, 52*b* respectively. Thus the repair is performed in response to the identification of the pressure transducer cross-connection.

In the case of a servo valve cross-connection the operator on the ground who is manually rotating the part of the tachometer observes the response of the first and second brakes 23*a*, 23*b*, and observes at step 79 that the incorrect brake (i.e. the second brake 23*b*) has been applied and released.

Since there is no tachometer cross-connection error, the first test signal is received at the braking control and monitoring system 29 from the first tachometer output line 24*a* of the first braking system. This causes the braking command to be issued on the first braking command line 31*a*, which is associated with the first tachometer output line 24*a* but connected in error to the second braking system 21*b*. This causes the second servo valve 30*b* to open and operate the second brake 23*b* via the hydraulic line 60*b*.

The control and monitoring system 29 also receives a signal from the second pressure transducer output line 51*b*. As the second brake 23*b* is applied, the pressure increases and the second pressure transducer communicates an "increased pressure" pressure signal to the control and monitoring system 29 via the second pressure transducer output line 51*b*.

The control and monitoring system 29 monitors whether the first or second pressure transducer responds to the braking command. In this case, the control and monitoring system 29 expects a signal from the first pressure transducer output line 51*a*, but receives one instead from the second pressure transducer output line 51*b*. The lack of signal from the first pressure transducer output line 51*a* means that the control and monitoring system 29 does not command the servo valve to reset. Rather, the control and monitoring system 29 responds to the lack of signal on the first pressure transducer output line 51*a* by displaying WHEEL 1 PRESSURE FAIL on the cockpit display device in the cockpit 12 at step 80.

The operator on the ground who had manually rotated the part of the tachometer and observed at step 79 that the incorrect brake (i.e. the second brake 23*b*) has been applied and released may then move to the cockpit and observe the WHEEL 1 PRESSURE FAIL message to determine that there is a servo valve cross-connection rather than a tachometer cross-connection (note that the operator on the ground knows that wheel 2 is the incorrect wheel). Alternatively the cockpit display may be observed by a second human operator, who communicates with the operator on the ground to determine which wheel is currently being tested (i.e. which tachometer was spun by the operator on the ground) and identify that there is a servo valve cross-connection.

At step 81, once a servo valve cross-connection has been identified, it is repaired by switching the first and second braking command lines 31*a*, 31*b* so they are connected to the first and second servo valves 32*a*, 32*b* respectively. Thus the repair is performed in response to the identification of the servo valve cross-connection.

The second tachometer 22*b* is identical to the first tachometer 22*a*. So the second tachometer 22*b* is not only configured to generate a second tachometer signal indicating rotation of the second wheel 20*b*, but it is further configured to generate a second test signal. The second wheel 20*b* is not rotating during the generation of the second test signal.

Figure 8:
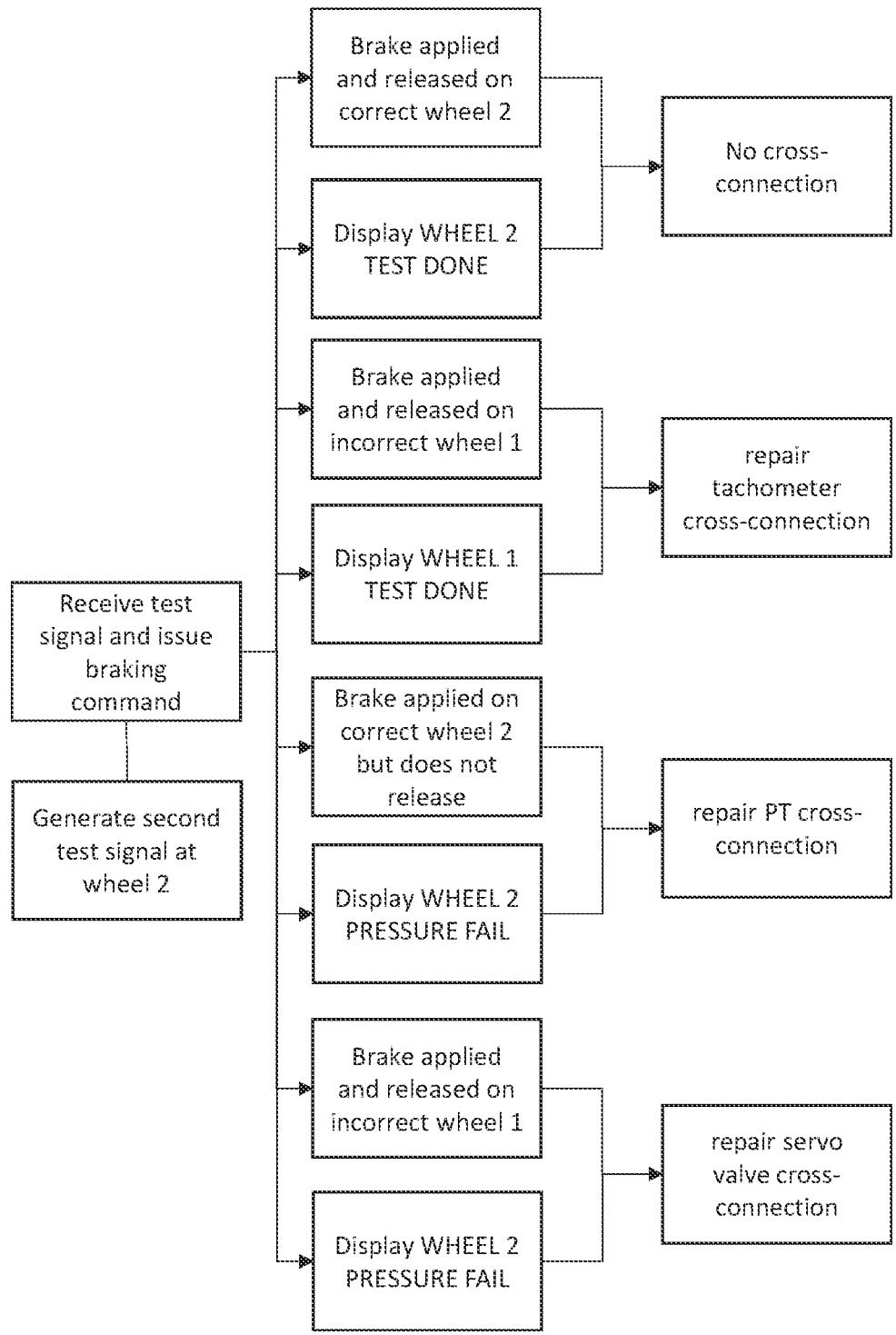
FIG. 8 shows a method of testing the second wheel of the landing gear.

Therefore the method of FIG. 7 may be repeated for the second wheel by rotating the tachometer rotor of the second tachometer then monitoring the response of the braking systems as shown in FIG. 8. Note that in FIG. 8 the first wheel 20*a* is referred to as wheel 1 and the second wheel 20*b* is referred to as wheel 2.

The methods described above have various advantages compared with the conventional method of testing for a landing gear cross-connection. Firstly, the landing gear does not need to be raised to enable the wheels to be spun. Secondly, a pair of drills is not required to spin the wheels. Thirdly, the method requires only one or two operators: one on the ground to spin the tachometer, and optionally one in the cockpit.

In the embodiments of FIG. 7 or 8, the test signal is generated by rotating part of the tachometer. In alternative embodiments, the test signal may be generated electronically by the tachometer without requiring any part of the tachometer to be rotated.

In the embodiments of FIGS. 7 and 8, the test signal is generated by rotating part of the tachometer back and forth by less than a full revolution. In other embodiments, the part of the tachometer may be rotated in one direction only and/or rotated by more than a full revolution.

In the embodiments of FIGS. 7 and 8, the response of the first or second braking system is monitored manually by a human watching the first or second brake, and is also monitored automatically by an automated monitoring system (the control and monitoring system 29) which monitors the response of the pressure transducers. This is preferred because it can provide a double check of the identity of the cross-connection, and/or may help to distinguish between a tachometer cross-connection and a servo valve cross-connection. In alternative embodiments, the response of the first or second braking system may be only monitored manually or only monitored automatically.

In the embodiments of FIGS. 7 and 8, the method comprises monitoring which braking system responds to the braking command, monitoring whether one of the brakes has been applied and not released, and monitoring which pressure transducer line responds to the braking command. Other ways of monitoring the response can be envisaged.

In the embodiments of FIGS. 7 and 8, the response of the first and second braking systems is monitored to test for three types of cross-connection: a cross-connection between the first and second tachometers, a cross-connection between the first and second servo valves, and a cross-connection between the first and second pressure transducers. In other embodiments, the method may only be used to test for one or two types of cross-connection. For instance if only the tachometers have been repaired, then it may only be necessary to test for a tachometer cross-connection. In this case, an observation by the operator on the ground of the incorrect brake being applied may be sufficient to indicate a tachometer cross-connection.

Figure 9:
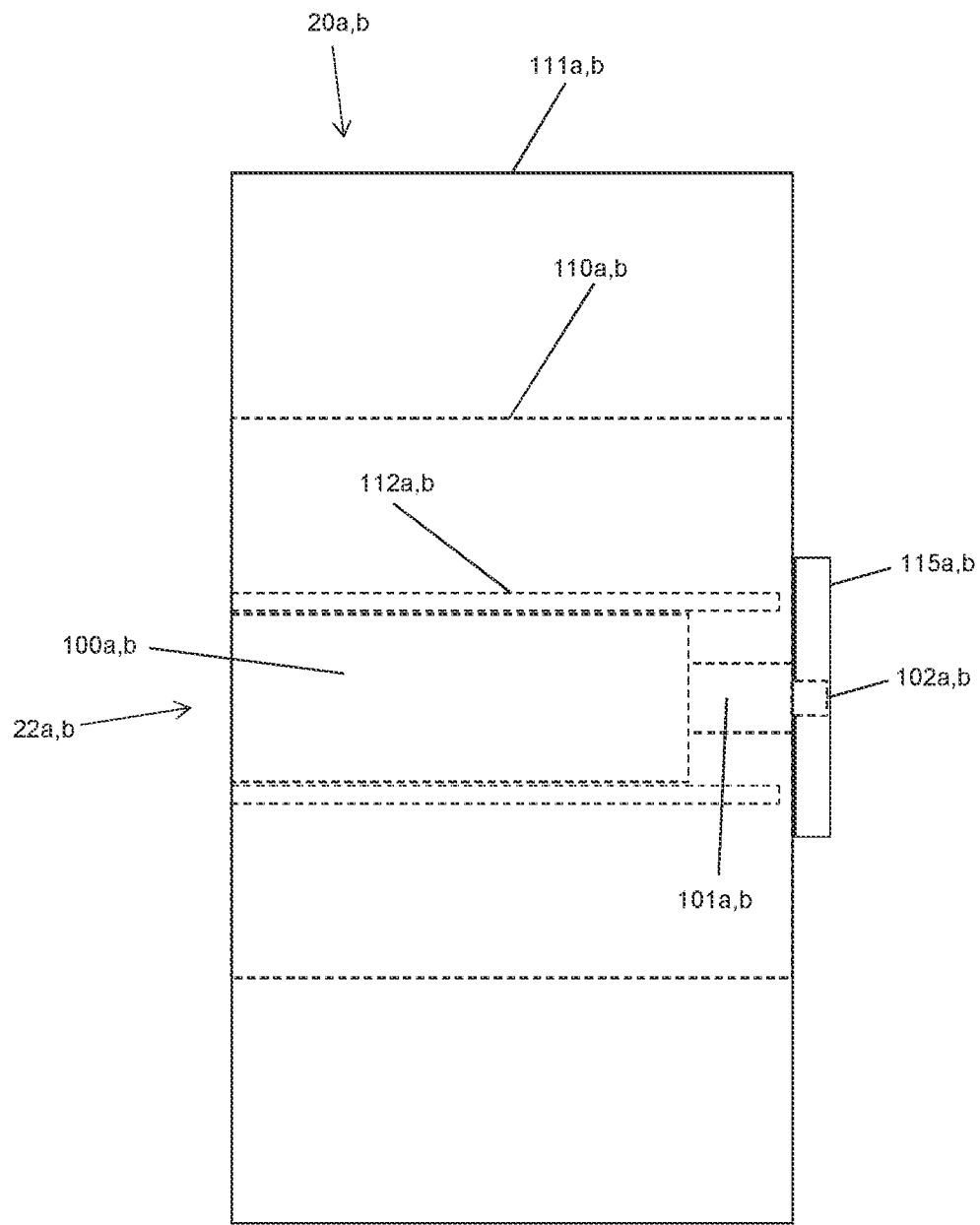
FIG. 9 shows a first tachometer arrangement.
Figure 10:
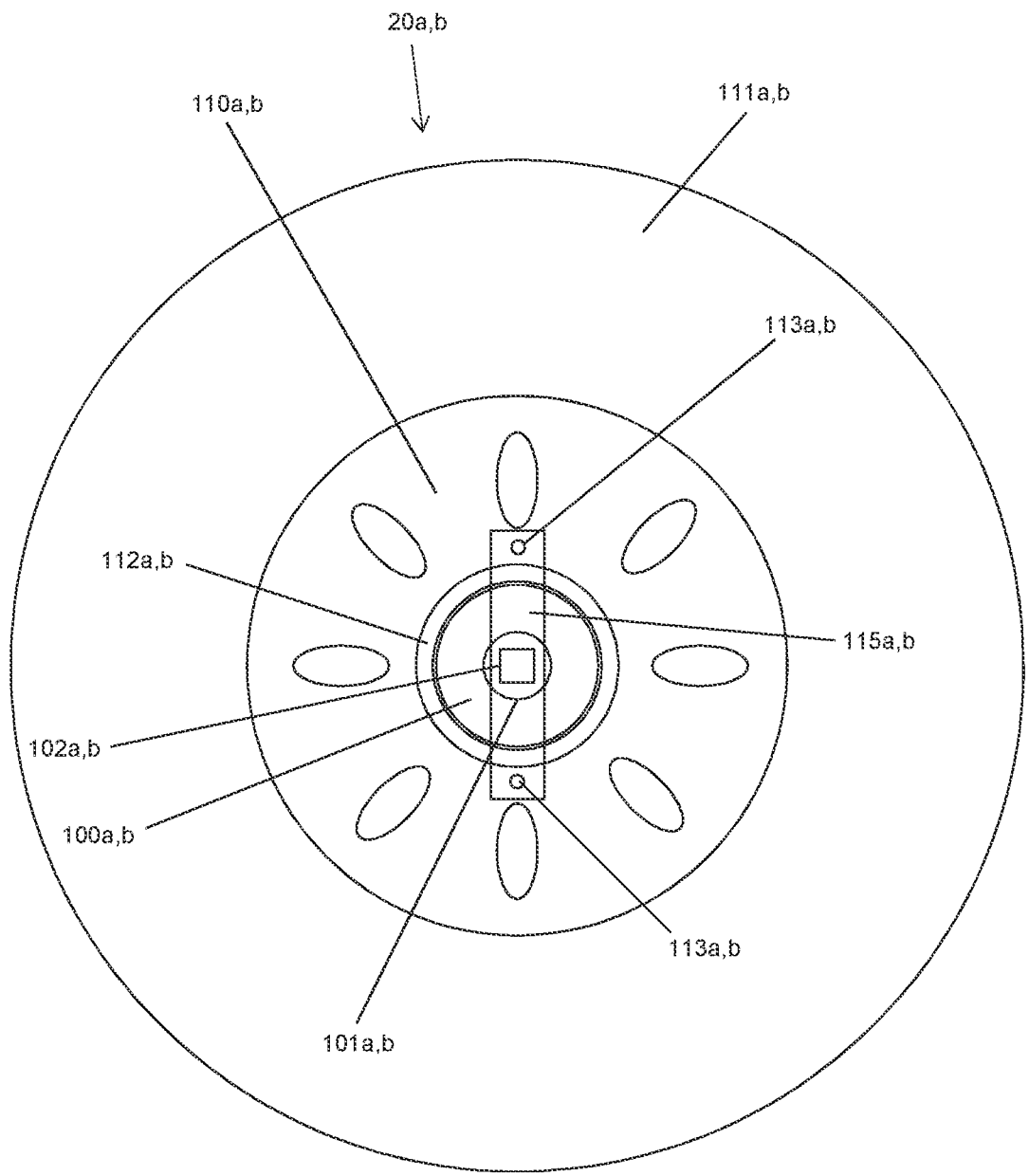
FIG. 10 is a side view of the wheel of FIG. 9.
Figure 12:
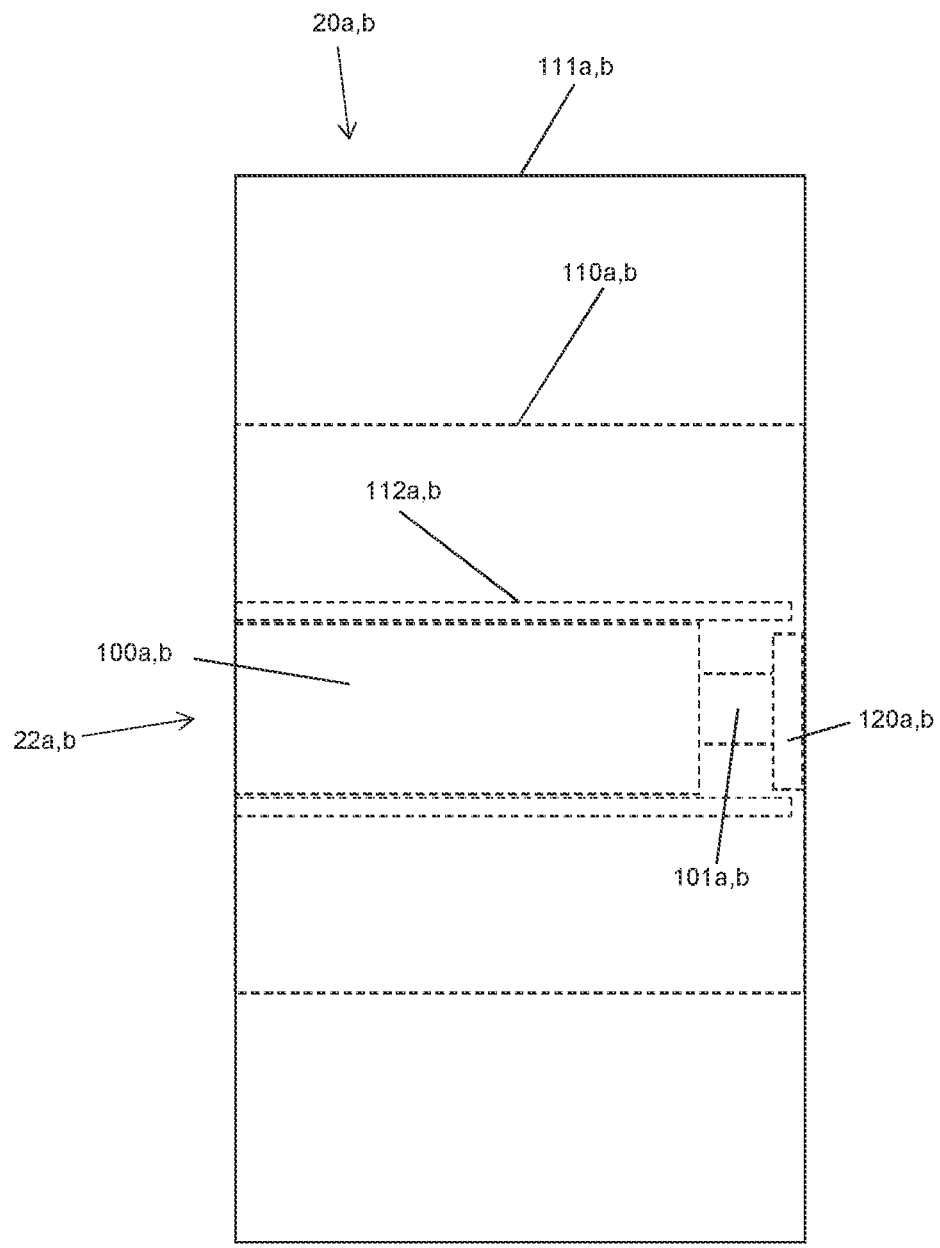
FIG. 12 shows a second tachometer arrangement.

FIG. 9 and FIG. 12 show two different tachometer arrangements which are configured to generate test signals mentioned above, wherein the wheel is not rotating during the generation of the test signal.

FIG. 9 shows a first arrangement of the first and second tachometers 22a,b in detail. The two tachometers 22a, b are identical, so both are shown in a single Figure.

Each tachometer comprises a tachometer rotor 101a,b, 102a,b configured to rotate with the wheel 20a,b, and a tachometer sensor 100a,b configured to measure rotation of the tachometer rotor to generate a tachometer signal indicating rotation of the wheel. The tachometer rotor in this case is a cylindrical shaft 101a,b with a square locator pin 102a,b. The shaft 101a,b is received inside the tachometer sensor 100a,b although other physical arrangements are possible. The tachometer sensor 100a,b may measure the rotation of the shaft 101a,b by any suitable means, such as a magnetic or optical measurement.

The wheel 20a,b comprises a wheel body 110a,b and a tire 111a,b. The wheel body 110a,b is mounted on an axle 112a,b. A bearing between the axle and the wheel enables the wheel to rotate relative to the axle 112a,b. The tachometer sensor 100a,b does not rotate with the wheel, and is housed inside the axle 112a,b which also does not rotate with the wheel.

The tachometer rotor is coupled to the wheel body 110a,b by a locking plate 115a,b. The square locator pin 102a,b is received in a square aperture in the locking plate 115a,b. The locking plate 115a,b is fastened to the wheel body by bolts 113a,b shown in FIG. 10.

The test signal is generated by decoupling the tachometer rotor 101a,b; 102a,b from the wheel, gripping the shaft 101a,b by hand and then manually rotating the shaft 101a,b without rotating the wheel. Specifically, the bolts 113a,b and locking plate 115a,b are removed to decouple the tachometer rotor from the wheel body so that the tachometer rotor is free to rotate independently of the wheel.

Figure 11:
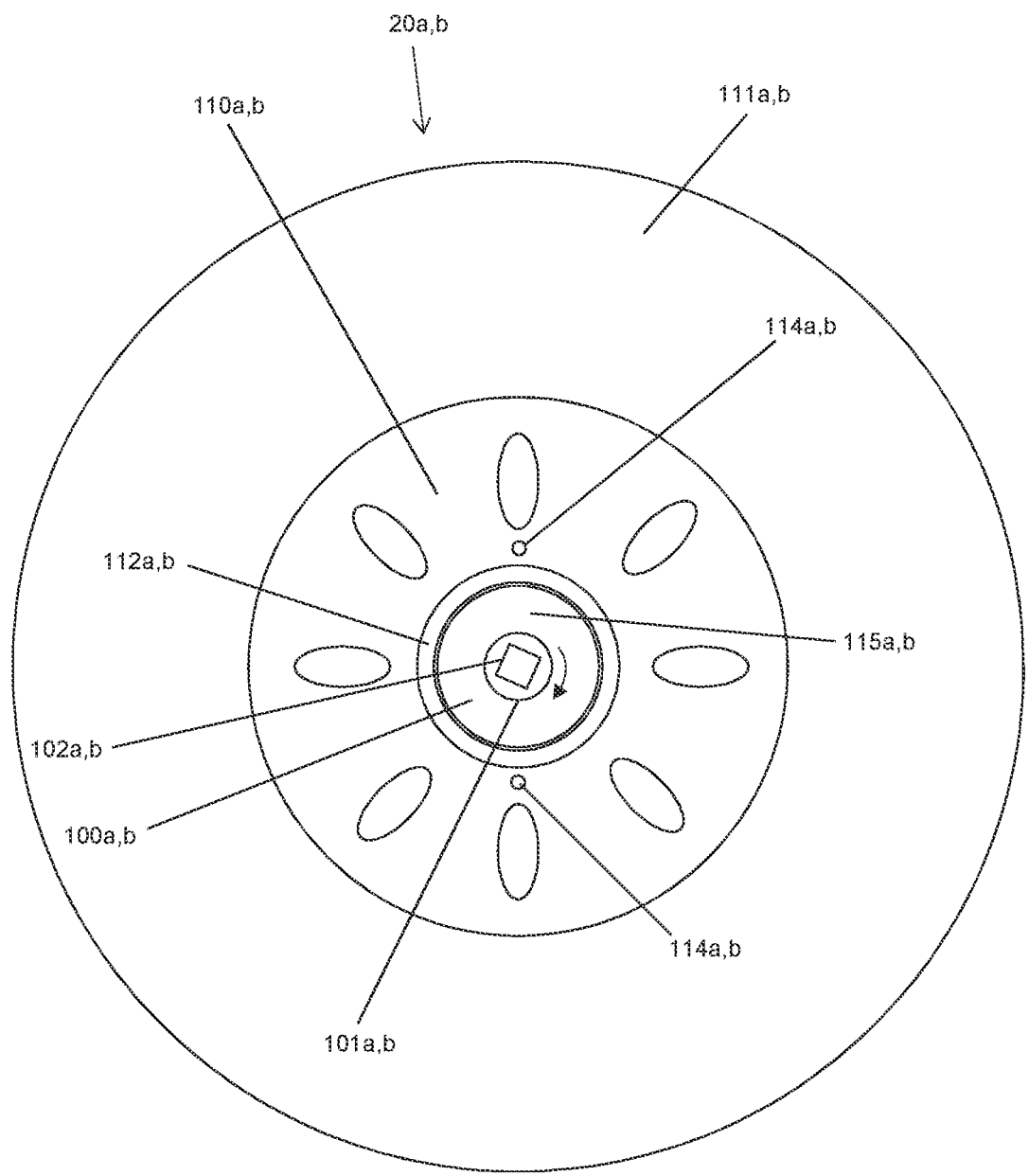
FIG. 11 shows the tachometer rotor being rotated after it has been decoupled from the wheel.

FIG. 11 shows tachometer rotor being rotated clockwise, and also shows bolt holes 114a,b in the wheel body which receive the bolts 113a,b. Tests have demonstrated that the test signal may be generated by rotating the tachometer rotor for as little as 150 ms, although typically it will be rotated back and forth for a longer period of time.

Figure 13:
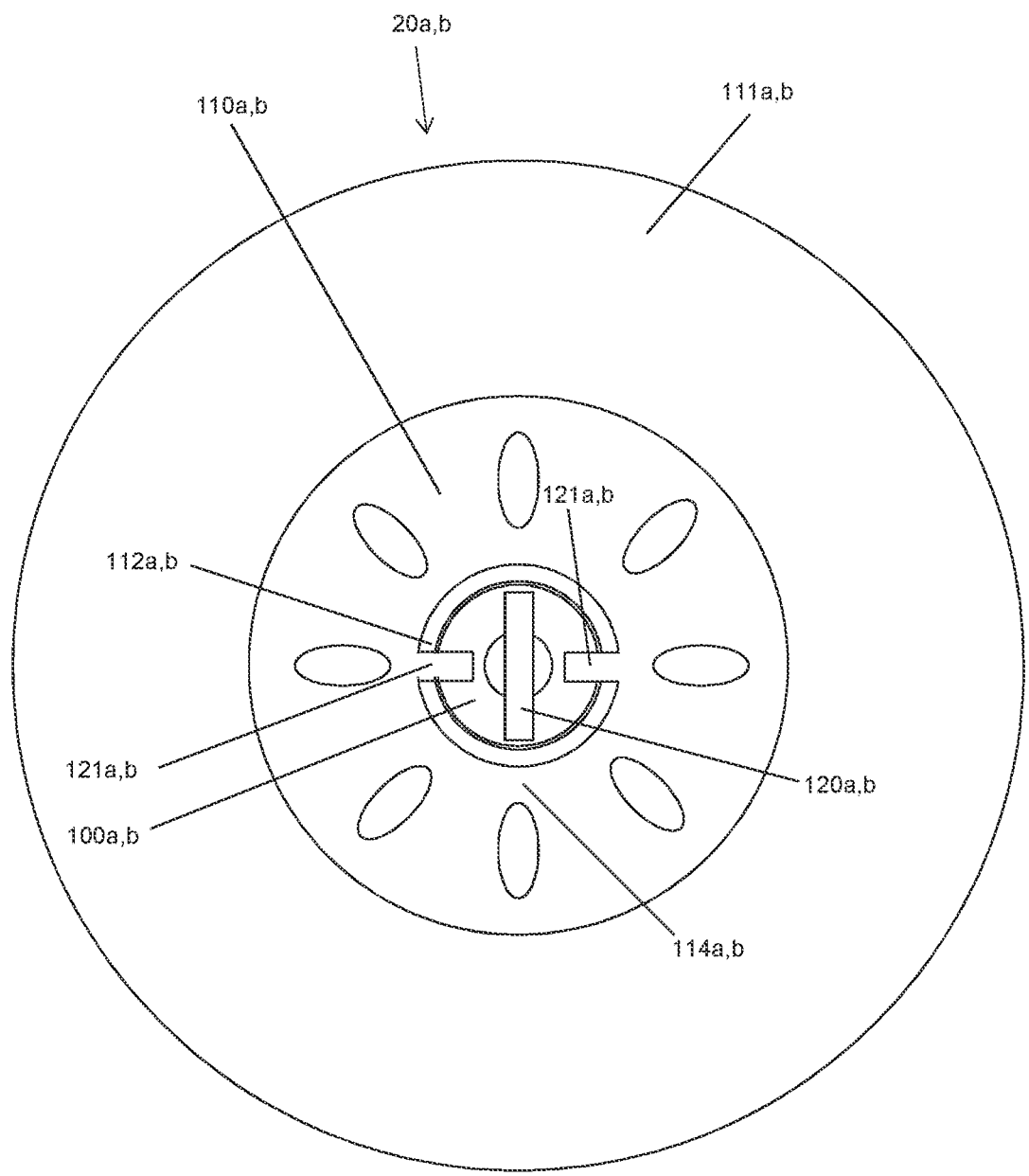
FIG. 13 is a side view of the wheel of FIG. 12 with the tachometer pin disengaged from the wheel.
Figure 14:
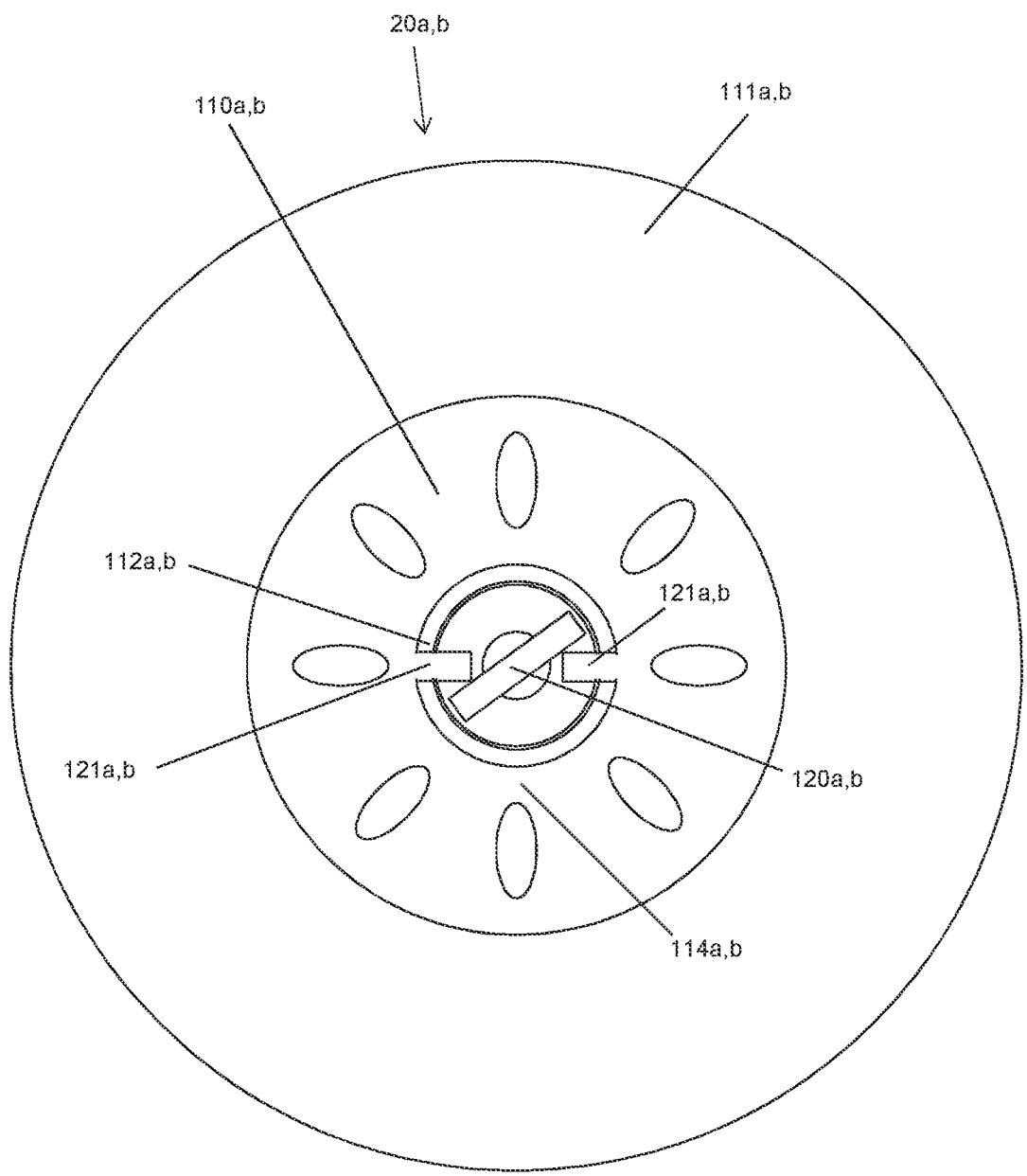
FIG. 14 is a side view of the wheel of FIG. 12 with the tachometer rotor rotated so that tachometer pin is engaged with the wheel.

FIGS. 12-14 show a second tachometer arrangement. Many elements are the same as in FIGS. 9-11, and the same reference numbers are used for such elements.

In this case the tachometer rotor is connected to the wheel body by a floating connection which is configured to enable the tachometer rotor to be rotated without rotating the wheel to generate the test signal. More specifically, the shaft 101a,b of the tachometer rotor carries a pin 120a,b at its distal end, and the wheel body 110a,b has a pair of stops 121a,b shown in FIG. 13. The tachometer rotor is free to rotate until the pin 120a,b engages the stops 121a,b as shown in FIG. 14. During rotation of the wheel, the stops 121a,b remain in contact with the pin 120a,b so the tachometer rotor is forced to spin with the wheel. When the wheel is stationary, a ground-based operator can grip the pin 120a,b and manually rotate it back and forth to generate the test signal.

In this case the floating connection is configured to enable the tachometer rotor to be rotated without rotating the wheel by approximately 90°, but in other embodiments of the invention the floating connection may only enable a smaller range of movement. Preferably the floating connection is configured to enable the tachometer rotor to be rotated by more than 10°, 20° or 30° without rotating the wheel.

Where the word 'or' appears this is to be construed to mean 'and/or' such that items referred to are not necessarily mutually exclusive and may be used in any appropriate combination.

Although the invention has been described above with reference to one or more preferred embodiments, it will be appreciated that various changes or modifications may be made without departing from the scope of the invention as defined in the appended claims.

The invention claimed is:

1. A method of testing an aircraft landing gear, the aircraft landing gear comprising:
   first and second wheels;
   a first braking system comprising a first tachometer mounted to the first wheel and configured to generate a first tachometer signal indicating rotation of the first wheel, and a first brake configured to brake the first wheel;
   a second braking system comprising a second tachometer mounted to the second wheel and configured to generate a second tachometer signal indicating rotation of the second wheel, and a second brake configured to brake the second wheel;
   first and second tachometer output lines;
   a first braking command line associated with the first tachometer output line; and
   a second braking command line associated with the second tachometer output line;
   the method comprising:
   a) generating a test signal with the first tachometer, wherein the first wheel is not rotating during the generation of the test signal;
   b) receiving the test signal via one of the tachometer output lines;
   c) issuing a braking command in response to the receipt of the test signal, wherein the braking command is issued via the braking command line which is associated with the one of the tachometer output lines;
   d) monitoring a response of the first or second braking system to the braking command to test for a cross-connection between the first and second braking systems; and
   e) detecting the cross-connection based on the monitoring.

2. A method according to claim 1, wherein the test signal is generated by rotating part of the first tachometer.

3. A method according to claim 2, wherein the part of the tachometer is rotated by less than a full revolution.

4. A method according to claim 2, wherein the part of the tachometer is rotated back and forth by less than a full revolution.

5. A method according to claim 1, wherein the first tachometer comprises a tachometer rotor configured to rotate with the first wheel and a tachometer sensor configured to measure rotation of the tachometer rotor to generate the first tachometer signal; and wherein the test signal is generated by rotating the tachometer sensor of the first tachometer, or by rotating the tachometer rotor of the first tachometer.

6. A method according to claim 1, wherein the response of the first or second braking system is monitored by a human watching the first or second brake.

7. A method according to claim 1, wherein the response of the first or second braking system is monitored by an automated monitoring system.

8. A method according to claim 1, wherein monitoring a response of the first or second braking system comprises monitoring whether the first or second braking system responds to the braking command.

9. A method according to claim 1, wherein monitoring a response of the first or second braking system comprises monitoring whether one of the brakes has been applied and not released.

10. A method according to claim 1, wherein the braking command is issued on only one of the braking command lines.

11. A method according to claim 1, wherein a cross-connection is indicated if the second braking system responds to the braking command.

12. A method according to claim 1, wherein monitoring a response of the first or second braking system comprises monitoring whether the first or second braking system responds to the braking command to test for a cross-connection between the first and second tachometers.

13. A method according to claim 1, wherein the first braking system comprises a first servo valve; the second braking system comprises a second servo valve; the braking command is issued to one of the servo valves; and monitoring a response of the first or second braking system comprises monitoring whether the first or second braking system responds to the braking command to test for a cross-connection between the first and second servo valves.

14. A method according to claim 1, wherein:
the first braking system further comprises a first pressure transducer configured to measure a hydraulic pressure in the first braking system to generate a pressure signal;
the second braking system further comprises a second pressure transducer configured to measure a hydraulic pressure in the second braking system to generate a pressure signal;
the aircraft landing gear further comprises a first pressure transducer line associated with the first tachometer output line and a second pressure transducer line associated with the second tachometer output line; and
monitoring the response of the first or second braking system comprises monitoring whether a pressure signal is received on the first or second pressure transducer line.

15. A method according to claim 1, wherein the first braking system comprises a first servo valve and a first pressure transducer; the second braking system comprises a second servo valve and a second pressure transducer; and monitoring the response of the first and second braking systems tests for a cross-connection between the first and second tachometers, a cross-connection between the first and second servo valves and a cross-connection between the first and second pressure transducers.

16. A method of testing and repairing an aircraft landing gear, the method comprising: testing the aircraft landing gear by a method according to claim 1 to identify a cross-connection between the first and second braking systems; and repairing the cross-connection between the first and second braking systems in response to the identification of the cross-connection.

17. An aircraft landing gear system comprising:
first and second wheels;
a first braking system comprising a first tachometer mounted to the first wheel, and a first brake configured to brake the first wheel, wherein the first tachometer is configured to generate a first tachometer signal indicating rotation of the first wheel and further configured to generate a first test signal, wherein the first wheel is not rotating during the generation of the first test signal;
a second braking system comprising a second tachometer mounted to the second wheel, and a second brake configured to brake the second wheel, wherein the second tachometer is configured to generate a second tachometer signal indicating rotation of the second wheel and further configured to generate a second test signal, wherein the second wheel is not rotating during the generation of the second test signal;
first and second tachometer output lines;
a first braking command line associated with the first tachometer output line;
a second braking command line associated with the second tachometer output line; and
a braking control and monitoring system configured to:
receive the first or second test signal via one of the tachometer output lines;
issue a braking command in response to the receipt of the first or second test signal, wherein the braking command is issued via the braking command line which is associated with the one of the tachometer output lines;
monitor a response of the first or second braking system to the braking command to test for a cross-connection between the first and second braking systems; and,
detect the cross-connection based on the monitoring.

18. An aircraft landing gear system according to claim 17, wherein:
the first tachometer comprises a first tachometer rotor configured to rotate with the first wheel; and a first tachometer sensor configured to measure rotation of the first tachometer rotor to generate the first tachometer signal;
the second tachometer comprises a second tachometer rotor configured to rotate with the second wheel; and a second tachometer sensor configured to measure rotation of the second tachometer rotor to generate the second tachometer signal;
wherein the first tachometer rotor is connected to the first wheel by a first floating connection which enables the first tachometer rotor to be rotated without rotating the first wheel to generate the first test signal; and
wherein the second tachometer rotor is connected to the second wheel by a second floating connection which enables the second tachometer rotor to be rotated without rotating the second wheel to generate the second test signal.

* * * * *